United States Patent [19]

Isohata et al.

[11] Patent Number: 4,878,086
[45] Date of Patent: Oct. 31, 1989

[54] FLAT PANEL DISPLAY DEVICE AND MANUFACTURING OF THE SAME

[75] Inventors: Junji Isohata, Tokyo; Masao Totsuka, Ohmiya; Yoshiharu Nakamura, Yokohama, all of Japan

[73] Assignee: Canon Kabushiki Kaisha, Tokyo, Japan

[21] Appl. No.: 326,108

[22] Filed: Mar. 20, 1988

Related U.S. Application Data

[60] Division of Ser. No. 203,558, Jun. 1, 1988, Pat. No. 4,814,830, which is a continuation of Ser. No. 129,363, Nov. 30, 1987, abandoned, which is a continuation of Ser. No. 838,824, Mar. 12, 1986, abandoned.

[30] Foreign Application Priority Data

Apr. 1, 1985 [JP] Japan ............................ 60-068736
Apr. 17, 1985 [JP] Japan ............................ 60-81840

[51] Int. Cl.⁴ ........................ G03B 27/32; G03B 27/44
[52] U.S. Cl. ........................ 355/77; 355/53; 355/54; 356/401
[58] Field of Search .............. 355/77, 53, 54, 43, 355/71; 356/401; 250/442.1

[56] References Cited

U.S. PATENT DOCUMENTS

| | | | |
|---|---|---|---|
| 4,128,331 | 12/1978 | Nakamura | 355/53 X |
| 4,362,385 | 12/1982 | Lobach | 355/53 X |
| 4,425,037 | 1/1984 | Hershel et al. | 355/53 X |
| 4,444,492 | 4/1984 | Lee | 355/54 X |
| 4,577,957 | 3/1986 | Phillips | 355/43 |
| 4,577,958 | 3/1986 | Phillips | 355/43 |
| 4,589,769 | 5/1986 | Matsuki | 355/71 |
| 4,603,968 | 8/1986 | Schmidt | 355/53 X |
| 4,659,226 | 4/1987 | Elabd | 355/53 X |
| 4,676,630 | 6/1987 | Matsushita et al. | 355/53 |
| 4,702,592 | 10/1987 | Geiger et al. | 355/54 X |
| 4,708,466 | 11/1987 | Isohata et al. | 355/53 X |
| 4,748,477 | 5/1988 | Isohata et al. | 355/53 |
| 4,748,478 | 5/1988 | Suwa et al. | 355/53 |
| 4,749,867 | 6/1988 | Matsushita et al. | 250/442.1 |
| 4,758,863 | 7/1988 | Nikkel | 355/53 X |
| 4,769,680 | 9/1988 | Resor, III et al. | 355/53 X |
| 4,814,830 | 3/1989 | Isohata et al. | 355/54 |

FOREIGN PATENT DOCUMENTS 54-134565 10/1979 Japan.
57-183032 11/1982 Japan.

OTHER PUBLICATIONS

"Lithography for Flat Panel Video Displays", Solid State Technology, Feb. 1988.

Primary Examiner—Richard A. Wintercorn
Attorney, Agent, or Firm—Fitzpatrick, Cella, Harper & Scinto

[57] ABSTRACT

A flat panel display device, such as a liquid crystal panel display device, of large size and a method and apparatus of manufacture of the same. The display device may be provided by discrete or divided display sections. For the manufacture of the panel display device, a pattern for forming picture elements and a drive circuit therefor is photolithographically transferred onto the whole surface of a substrate or base plate in a step-and-repeat manner. In one aspect of the invention, different masks having patterns corresponding to portions of the first-mentioned pattern are used. After the pattern of one of the masks is transferred onto one portion of the substrate, the one mask is replaced by another which the substrate is moved stepwise so that the pattern of the other mask can be transferred onto another portion of the substrate. By repeating the pattern transfer, with different masks, and repeating the stepwise movement of the substrate, the whole of the first-mentioned pattern is transferred onto the whole surface of the substrate with a high resolving power.

1 Claim, 13 Drawing Sheets

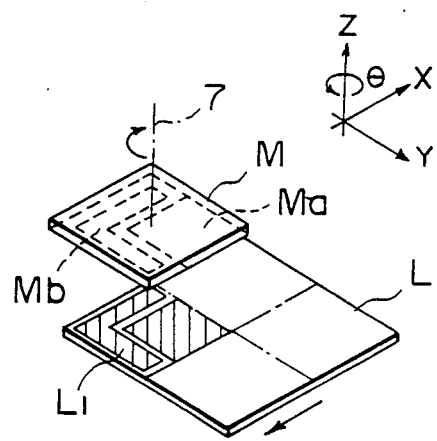
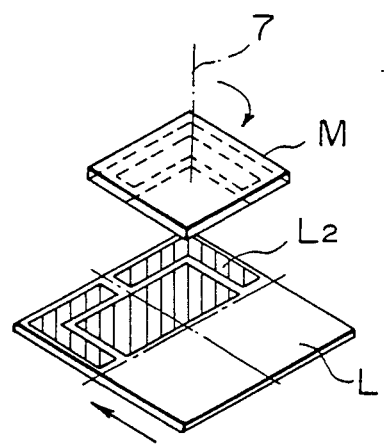
FIG. 12A          FIG. 12B
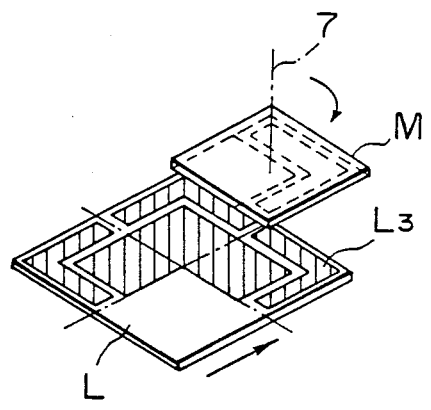
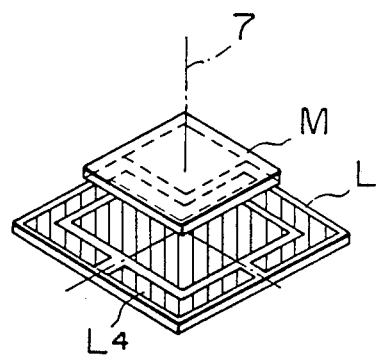
FIG. 12C          FIG. 12D

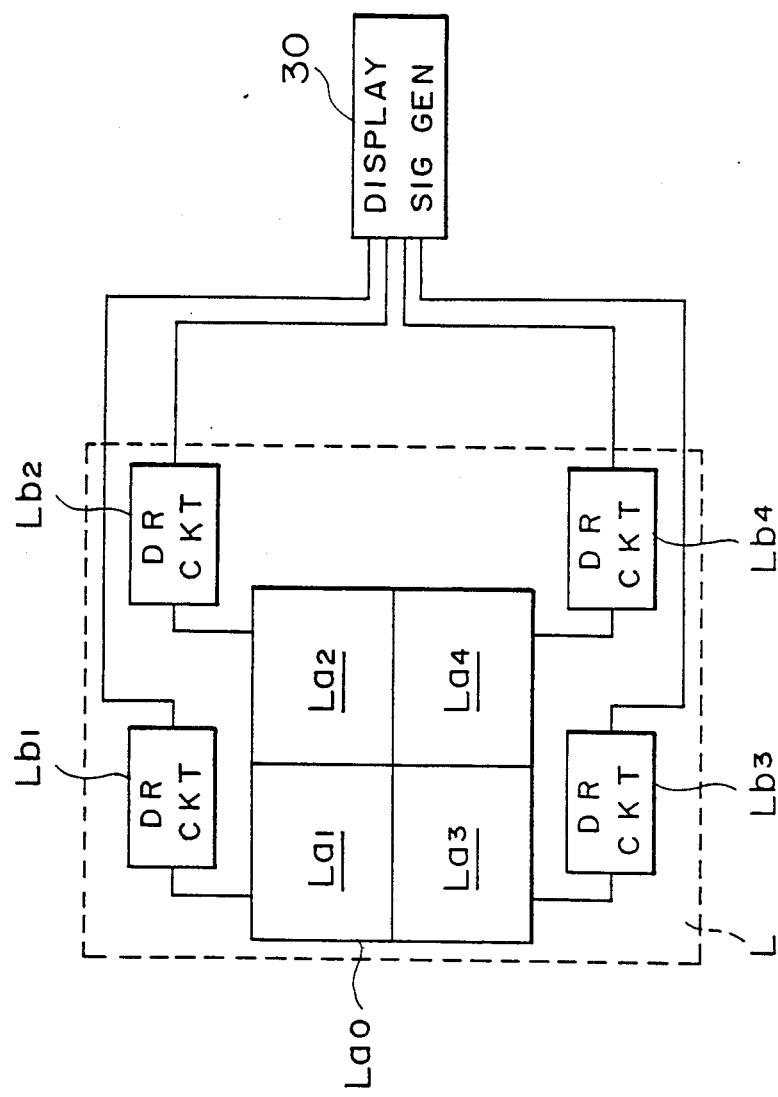
F I G. 14

FLAT PANEL DISPLAY DEVICE AND MANUFACTURING OF THE SAME

This application is a division of application Ser. No. 07/203,558 filed June. 1, 1988 of Junji Isohata, et al., now U.S. Pat. No. 4,814,830, issued Mar. 21, 1989 which is a continuation of application Ser. No. 07/129,363, filed Nov. 30, 1987, abandoned which was a continuation of application Ser. No. 06/838,824 filed Mar. 12, 1986, now abandoned.

FIELD OF THE INVENTION AND RELATED ART

This invention relates to a flat panel display device and manufacture of the same. More particularly, the invention is concerned with a flat panel type large-size display device such as a liquid crystal display device, an electroluminescence display device, etc. and manufacture of the same by use of an exposure apparatus for photolithographically transferring onto a substrate or base plate a fine circuit pattern necessary for forming the display device.

Exposure apparatuses for use in a photolithographic process are well known in the field of manufacture of semiconductor elements such as integrated circuits. There have been developed in this field various types of exposure apparatuses such as, for example, contact type exposure apparatuses, proximity type exposure apparatuses, mirror projection type exposure apparatuses, lens projection type exposure apparatuses and the like. In the contact type or proximity type exposure apparatuses, the whole surface of a mask having a circuit pattern is illuminated at once while the mask and a semiconductor wafer is kept in contact with each other or a minute gap is maintained between the mask and the wafer, with the result that the mask pattern is transferred onto the wafer at once. The mirror projection type exposure apparatuses use a mirror projection system comprising a combination of a convex mirror and a concave mirror, for which system the mask and the wafer are disposed in an optical conjugation relation. The mask and the wafer are moved as a unit relative to the mirror projection system while irradiating the mask with a light beam which is shaped to define an illumination area of arcuate shape on the mask. By this, the mask is scanningly exposed to the light, such that the mask pattern is scanningly transferred onto the wafer. On the other hand, the lens projection type exposure apparatuses use a lens projection system having a unit or reduced magnification. By this projection lens, the pattern of the mask is projected onto the wafer in a unit or reduced scale. The wafer is moved stepwise after one of discrete areas (shot areas) on the wafer is exposed to the light from the mask. By repeating such exposure combined with the stepwise movement, images of the mask pattern are transferred onto respective shot areas on the wafer.

In the field of manufacture of semiconductor devices, enlargement of the semiconductor wafer (wafer diameter) has been desired in order to reduce the manufacturing cost per one chip (semiconductor chip). Also, in a field of display devices such as liquid crystal display devices, electroluminescence display devices, electrochromic display devices, plasma display devices, fluorescent display devices and the like, development of flat panel type large-size display devices has been desired.

In consideration of the above, it is desirable in the field of photolithographic exposure apparatuses to realize such an apparatus that is capable of transferring a large-area pattern onto a large-area substrate or base plate.

One way to meet this is use of a mask or photomask having a large size corresponding to the large-diameter wafer or a large-size glass plate constituting the flat panel display device, such that a large-size circuit pattern or a large-size picture-element pattern formed on the mask is transferred onto the wafer or the glass plate at once. However, this involves various problems such as follows:

(1) The mask usually should have a dimension larger than that of the wafer or glass base plate. Fabrication of the mask becomes more and more difficult with the enlargement of the mask to be made.

(2) The degree of flatness of the wafer or glass base plate is lowered with the enlargement of the wafer or base plate. Such deterioration in flatness results in failure of intimate contact between the mask and the wafer or base plate, in irregularity of the gap between the mask and the wafer or base plate, or in failure of correct focus over the whole surface of the mask or base plate. It is therefore difficult to accomplish high-resolution pattern transfer over the entire surface of the wafer or base plate, which leads to a decreased throughput.

(3) An illumination optical system, a projection optical system and the like must be made large in accordance with the enlargement of the exposure area (pattern transfer area). This makes the fabrication of the optical systems more difficult. Also, a large space is required.

(4) To illuminate the large-size pattern uniformly is difficult to achieve.

(5) Deformation of the wafer or base plate due to thermal expansion/contraction becomes more significant, resulting in deterioration in the accuracy of alignment of the mask and the wafer or base plate.

Particularly, in the manufacture of the flat panel display device, it is possible that the enlargement of the panel size causes disadvantageous effects such as follows:

The enlargement of the size of display plane involves an increase in the electric resistance of a wiring portion. Also, the enlargement of the panel size requires a complicated driving circuit and an increased number of driving terminals. Further, high speed display of information is not easy to achieve.

SUMMARY OF THE INVENTION

It is accordingly a primary object of the present invention to provide a flat panel display device of large size which can be manufactured with a reduced cost and which allows easy incorporation of a driving circuit.

It is another object of the present invention to provide an exposure apparatus capable of transferring a pattern or patterns onto the whole surface of a large-diameter semiconductor wafer or a large-size base plate for a large-size flat panel display device, with a high resolving power and high alignment accuracy.

Briefly, according to one aspect of the present invention, there is a provided a display device, comprising: a base plate; a display region defined on said base plate, said display region being provided by a plurality of display sections each formed by a photolithographic process; and a non-display region defined on said base plate so as to substantially surround said display region, said non-display region being provided by a plurality of non-display sections each formed by a photolithographic process and having an element contributable to drive at least one of said display sections.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 12A-12D are schematic views, respectively, for explaining the operation of the exposure apparatus of the FIG. 11 embodiment.

FIG. 14 is a block diagram for explaining the manner of a flat panel display device according to one embodiment of the present invention.

DESCRIPTION OF THE PREFERRED EMBODIMENTS

Figure 1:
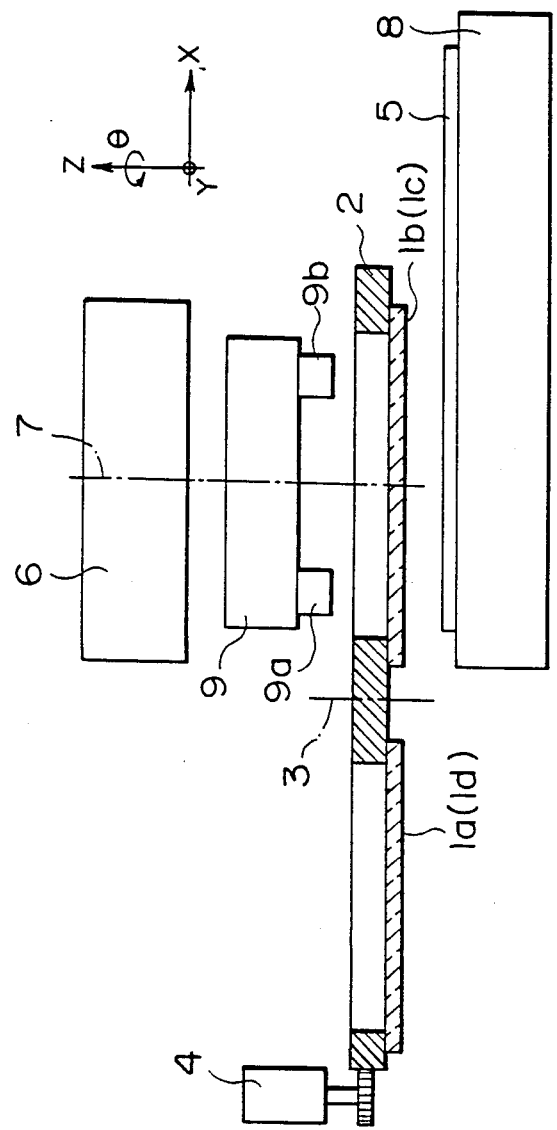
FIG. 1 view showing one embodiment of an exposure apparatus of proximity type, to which the present invention is applied.

Referring first to FIG. 1, there is shown an exposure apparatus according to one embodiment of the present invention. In this embodiment, the exposure apparatus is of proximity type, of the types described hereinbefore.

In FIG. 1, the apparatus is used with four masks 1a-1d (only two of which are shown in FIG. 1). Each of the masks 1a-1d has formed thereon an individual circuit pattern for the manufacture of semiconductor devices, or an individual pattern for the manufacture of flat panel display devices such as liquid crystal display devices. Where the liquid crystal display devices are to be manufactured, each of the masks 1a-1d is formed with a pattern having a portion for forming plural picture elements in the liquid crystal display device and a portion for forming a driving circuit for driving the picture elements. The four masks 1a-1d are supported by a mask stage 2 in the manner shown in FIG. 2A. That is, the mask stage 2 holds the masks 1a-1d so that they are placed at the same distance from the center 3 of the stage 2 and so that they are disposed equiangularly with respect to the center 3 mask stage 2 is rotatable by means of a motor 4 in the $\theta$ about an axis (Z axis) passing through the center 3 of the stage 2. The motor 4 drives the mask stage 2 rotationally, so that the masks 1a-1d are sequentially positioned at an exposure station whereat the pattern of the mask is to be transferred onto a glass base plate 5. The glass plate 5 is a base member for a flat panel liquid crystal display device, in this embodiment. For the manufacture of the display device, a pattern corresponding to a number of picture elements and the same number of switching transistors each being operationally associated with one of the picture elements to control actuation and de-actuation of the same picture element is to be formed on the glass base plate by a photolithographic process which is known per se. The glass base plate 5 has a square or oblong shape having a length, in the diagonal direction, of an order of 14 inches. While not shown in the drawing, the glass base plate 5 is coated with a photoresist or photosensitive material.

The exposure apparatus further includes an illumination optical system 6 for irradiating one of the masks 1a-1d as placed at the exposure station with a predetermined wavelength of light supplied from an unshown light source. By irradiating the mask placed at the exposure station with light a, corresponding one of portions or areas of the photosensitive layer on the glass base plate 5 is exposed to the light passed through the mask, such that the pattern of the mask is transferred onto the one portion of the glass base plate 5. Hereinafter, the optical axis of the illumination optical system as denoted by numeral 7 in FIG. 1 will be referred to as a "Z direction", and two orthogonal directions contained in a plane which is perpendicular to the optical axis 7 will be referred to, respectively, as an "X direction" and a "Y direction". Also, a rotational direction about the Z-axis will hereinafter be referred to as a "$\theta$ direction". A stage 8 is adapted to hold thereon the substrate or base plate 5. Also, the stage 8 is adapted to move the base plate 5 in each of the X, Y, Z and $\theta$ directions. By the stage 8, the base plate 5 is placed in close proximity to the mask stage 2, with respect to the Z direction. Also, the base plate 5 is moved in the X and/or Y direction by the stage 8 so that a desired one of unexposed portions of the base plate 5 is opposed to one of the masks 1a-1d as placed at the exposure station. The displacement of the stage 8 for moving the base plate 5 is controlled by a fine measuring system using an unshown laser interferometer unit.

Similar to the manufacturing processes for semiconductor devices, the manufacture of flat panel display devices involves processes for superimposingly transferring different patterns onto the same area of the glass substrate. And, upon such superposition of different patterns, it is necessary that one pattern which is just going to be transferred onto the glass substrate is accurately overlaid on a pattern or patterns already "printed" on the glass substrate. So, it is necessary that a mask having the one pattern, just to be transferred, is accurately aligned with the pattern or patterns already printed on the glass substrate. For this purpose, the exposure apparatus includes an alignment detecting system 9 arranged to detect the positional relation between one of the masks 1a–1d, being placed at the exposure station, and one of plural areas (four areas in this embodiment) of the glass substrate 5 which area is also placed at the exposure station so that the pattern of the aforesaid one mask is to be transferred onto it. The alignment detecting system 9 includes two objective lenses 9a and 9b which are adapted to observe, at the same time, two alignment marks formed on the mask being placed at the exposure station and two alignment marks printed in one of the four areas of the glass substrate 5, also being placed at the exposure station. The alignment marks of the mask are directly observed by the objective lenses 9a and 9b, while the alignment marks of the glass substrate 5 are observed by the objective lenses by way of the mask being placed at the exposure station.

The alignment and exposure operation of the present embodiment will now be described, taken in conjunction with FIGS. 2A–2D.

Figures 2A, 2B:
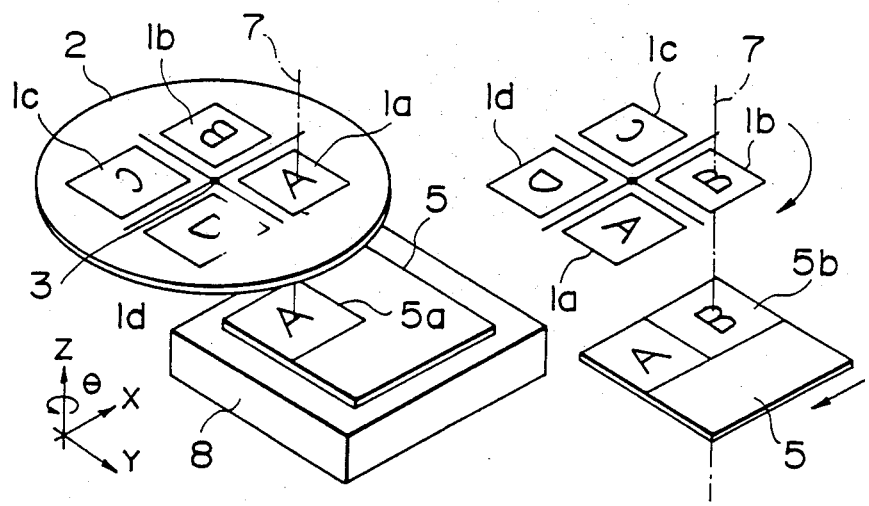
FIGS. 2A-2D are schematic views, respectively, for explaining the operation of the exposure apparatus the FIG. 1 embodiment.
Figures 2C, 2D:
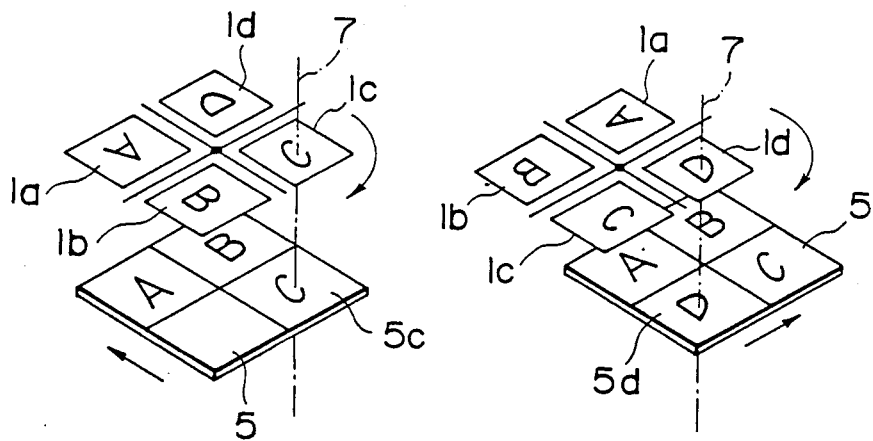

First, as seen from FIG. 2A, the masks 1a–1d are placed on the mask stage 2. Each of the masks 1a–1d has an individual or discrete pattern which is to be transferred onto a corresponding one of four areas on the glass substrate 5. The masks 1a–1d are placed at respective positions which are determined by the sequential order for transferring the four patterns. Also, each of the masks 1a–1d is set so that, when it is moved to the exposure station, the center of its own pattern comes coincident with the optical axis 7 of the illumination system 6, and, then, the masks 1a–1d are supported by the mask stage 2. Subsequently, by use of an unshown transportation system, the glass substrate 5 is conveyed onto the stage 8. In the course of such transportation of the glass substrate 5, preparatory alignment (prealignment) of the glass substrate with respect to the stage 8, being placed at a reference position, is effected by an appropriate prealignment unit. So, when the glass substrate 5 is placed on the stage 8, a portion or area 5a of the glass substrate 5 is at a position which is approximately aligned with the position of the mask 1a which is placed at the exposure station, at this time. After the glass substrate 5 is held on the stage 8, an unshown Z-axis driving system of the stage 8 is actuated to move the glass substrate 5 in the Z direction, in accordance with output signals from unshown gap sensors, so that a minute gap of an order not more than 30 microns, for example, is uniformly maintained between the mask 1a and the glass substrate 5.

If any pattern or patterns have already been printed on the area 5a of the glass substrate 5, the alignment detecting system 9 is operated to detect the positional relation between the mask 1a and the pattern or patterns already printed on the area 5a, and an appropriate one or ones of an unshown X-axis driving system, an unshown Y-axis driving system and an unshown θ-direction driving system of the stage 8 are actuated in accordance with an output signal from the alignment detecting system 9. By this, the mask 1a and the area 5a of the substrate 5 are brought into alignment with each other. Upon completion of alignment, the mask 1a is illuminated with the light from the illumination system 6 and, as a result of which, the photoresist layer on the area 5a of the substrate 5 is exposed to the light passed through the mask 1a. By this, the pattern of the mask 1a (which is exemplarily illustrated as a character "A" in FIG. 2A) is transferred onto the area 5a of the glass substrate 5.

Upon completion of transfer of the pattern "A" onto the area 5a, the mask stage 2 is rotationally moved clockwise by the motor 4 by an angle of 90 degrees, such as shown in FIG. 2B, so that the mask 1B is now placed at the exposure station. Simultaneously therewith, the stage 8 is moved in a direction denoted by an arrow shown in FIG. 2B and through a predetermined distance. By this, a next or second area 5b of the glass substrate 5 is placed at the exposure station, so that it is opposed to the mask 1b. Where any pattern or patterns have already been transferred onto the area 5b, accurate positioning of the area 5b in the X, Y, Z and θ directions relative to the mask 1b is effected in the same manner as has been described hereinbefore. Upon completion of alignment, the pattern of the mask 1b, which is exemplarily illustrated as a character "B" in FIG. 2B, is transferred onto the area 5b of the glass substrate 5. Subsequently, the rotational movement of the mask stage 2 and the stepwise movement (i.e. rectilinear displacement by a certain distance) of the stage 8 are repeated each time a mask, being placed at the exposure station, is illuminated by the illumination system 6, as seen from FIGS. 2C and 2D. By this, the pattern of the mask 1c which is exemplarily illustrated as a character "C" is transferred onto a third portion or area 5c of the glass substrate 5, while the pattern of the mask 1d which is exemplarily illustrated as a character "D" is transferred onto a fourth portion or area 5d of the glass substrate. The patterns "A", "B", "C" and "D" of the masks 1a–1d are transferred onto the whole surface of the glass substrate 5 without any overlap or with a slight overlap, with the result that a number of picture elements and the same number of switching transistors, constituting a flat panel liquid crystal display device, are formed on the glass substrate.

Figure 3A:
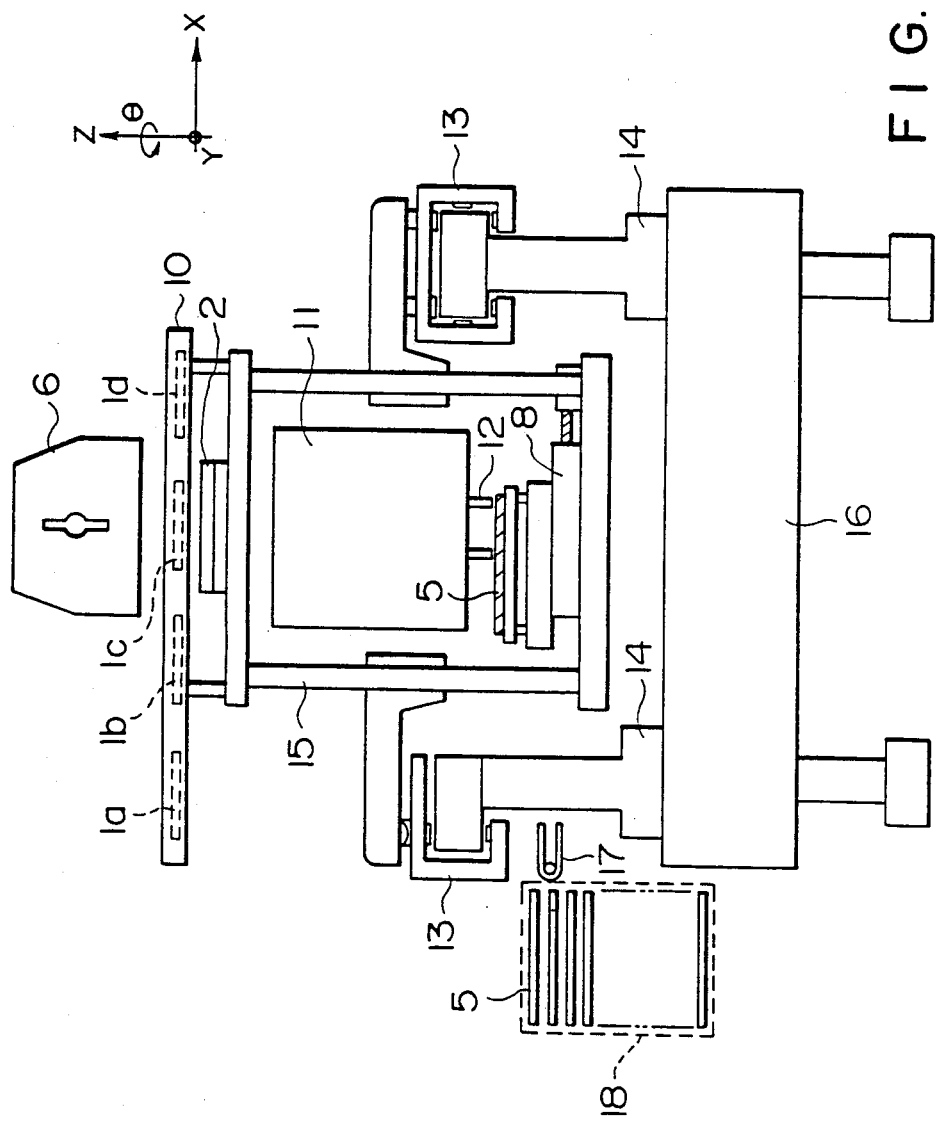
FIG. 3A is a schematic view showing one embodiment of an exposure apparatus of mirror projection type, to which the present invention is applied.

Referring now to FIGS. 3A–3D and FIG. 4, another embodiment of the present invention will be described. In this embodiment, the present invention is applied to an exposure apparatus of mirror projection type. In the present embodiment, elements having similar or corresponding functions as of those of the FIG. 1 embodiment are denoted by the same reference numerals, in FIGS. 3A–3C and FIG. 4. Referring to FIG. 3A, the exposure apparatus includes a mask plate 10 which is arranged to sequentially supply masks 1a–1d to a mask stage 2. The apparatus further includes a known type mirror projection system 11 comprising a combination of concave and convex mirrors adapted to project, at a unit magnification in this embodiment, a pattern of one of the masks 1a–1d which is held at a predetermined position by the mask stage 2, onto a substrate or base plate 5 held on a stage 8. mounted on a lower portion of the projection system 11 are gap sensors 12 for detecting the distance between a focal plane of the projection system 11 and the surface of the substrate 5. Each of the gap sensors 12 comprises an air-microsensor. It is a possible alternative to use a photoelectric sensor for detecting a light reflected from the substrate 5, thereby to detect the distance or interval between it and the focal plane of the projection system 11. By the provision of plural gap sensors 12, the distance from the substrate 5 surface to the focal plane of the projection system 11 is detected with respect to plural points on the substrate 5 surface. Linear air-bearing units 13—13 are movable along respective guide rails 14—14 each extending in the Y direction (a direction perpendicular to the sheet of FIG. 3A). One of the linear airbearing units 13—13 is of a type wherein displacement in each of the X and Z directions is restrained, while the other is of a type wherein displacement in the Z direction is restrained. The projection system 11 has an optical axis which is in alignment with the optical axis 7 of the illumination system 6.

The exposure apparatus further includes a holder 15 for holding, in a predetermined interrelation, the mask stage 2, the stage 8 for the substrate, and the mask plate 10. The mask stage 2 is movably supported by the holder 15 for fine adjustment of the position of the mask stage 2, carrying one of the masks 1a-1d, relative to the projection system 11. On the other hand, the stage 8 for carrying the substrate 5 is fixedly secured to a base member of the holder 15. The holder 15 is supported by the linear air-bearing units 13—13, such that one of the masks 1a-1d as carried by the mask stage 2 and the substrate 5 carried on the stage 8 are movable as a unit relative to the projection system 11. All of the illumination system 6 for illuminating one mask being carried by the mask stage 2, the mirror projection system 11 and the guide rails 14—14 are supported by a base 16, so that a predetermined interrelation is maintained between these components. The exposure apparatus further includes a known type conveyor belt 17 which is one component of a substrate supply system for supplying, sequentially, a plurality of substrates or base plates 5—5 contained in a base-plate containing cassette 18. Each of the base plates 5—5 contained in the cassette 18 is taken out from the cassette 18 by the belt 17 and is conveyed onto the stage 8. In the course of such transportation of the base plate 5, preparatory alignment (prealignment) of the base plate 5 with respect to the stage 8, which is at an initial or reference position, is effected by means of a suitable prealignment system. When the substrate 5 is placed on and held by the stage 8, it is now movable in the X, Y, Z and $\theta$ directions with the aid of drive sources such as motors. The displacement of the substrate 5 in each of the X and Y directions is controlled by means of an unshown measuring system using a laser interferometer.

Figure 3B:
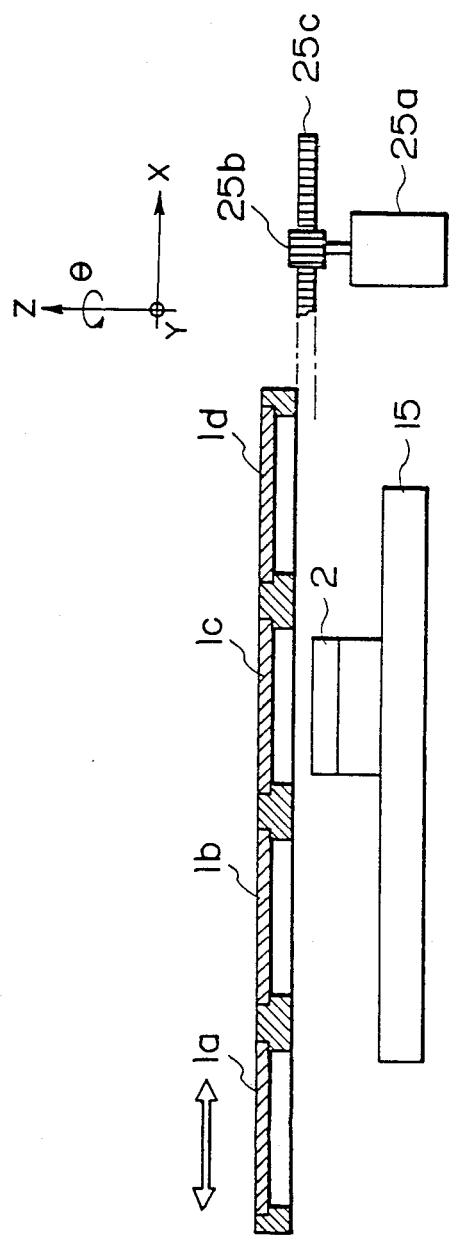
FIGS. 3B and 3C are schematic views, respectively, showing a mask changing mechanism of the exposure apparatus of FIG. 3A.
Figure 3C:
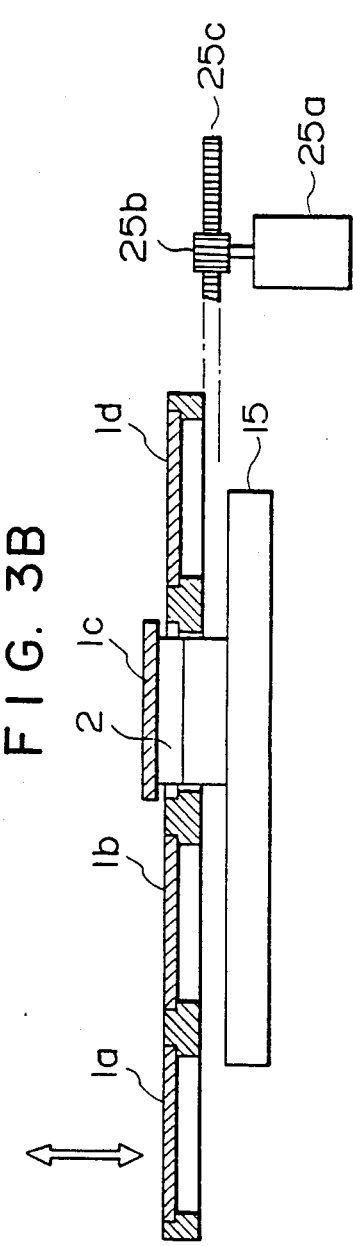

FIGS. 3B and 3C show details of a mask changing mechanism employed in the exposure apparatus of the present embodiment.

When the masks 1a-1d are placed on the mask plate 10 (FIG. 3A), they are supported in their places by four shouldered-apertures, respectively, formed in the mask plate 10. A motor 25a has a drive shaft and a pinion gear 25b mounted on an end of the drive shaft. The pinion 25b is in mesh-engagement with teeth of a rack gear 25c formed on an extension of the mask plate 10. Thus, rotation of the drive shaft of the motor 25a causes rotation of the pinion 25b, which causes translation of the mask plate 10 in the X direction. The actuation of the motor 25a is controlled by means of an unshown control unit so that the masks 1a-1d are sequentially conveyed to a position above the mask stage 2. Where a pattern of one of the masks, e.g. the pattern of the mask 1c, is to be transferred onto the substrate 5, the mask plate 10 is moved by the motor 25a so that the mask 1c is placed at the position above the mask stage 2 (the FIG. 3B position). Then, the mask plate 10 carrying the four masks is moved downwardly together with the motor 25a by means of an unshown lift mechanism supported by the holder 15, such that the mask stage 2 enters into the shouldered aperture supporting the mask 1c. As the mask plate 10 moves downwardly, the mask stage 2 contacts the lower surface of a peripheral portion of the mask 1c and lifts the same upwardly. By this, the mask 1c is separated or unloaded from the mask plate 10 (see FIG. 3C). The irradiation of the mask 1c with the light from the illumination system 6, for the sake of pattern transfer, is effected while the mask 1c is held in the "lifted" position relative to the mask plate 10.

After completion of the lithographic transfer of the pattern of the mask 1c onto the substrate 5, the mask plate 10 is moved upwardly and, thus, the mask 1c is held again on the plate 10. Each of the shouldered-apertures formed in the mask plate 10 has a sufficient size or dimension which allows, when the mask stage 2 has penetrated therethrough to lift the corresponding mask, slight displacement of the mask stage 2 relative to the mask plate 10 for the sake of fine adjustment of the position of the mask stage 2 and, therefore, the position of the mask carried on the mask stage 2, in the X and Y directions relative to the mirror projection system 11.

The remaining portion of the structure and function of the present embodiment is essentially the same as that of the foregoing embodiment.

Details of the operation of the present embodiment will now be described, taken in conjunction with FIG. 4.

Figure 4:
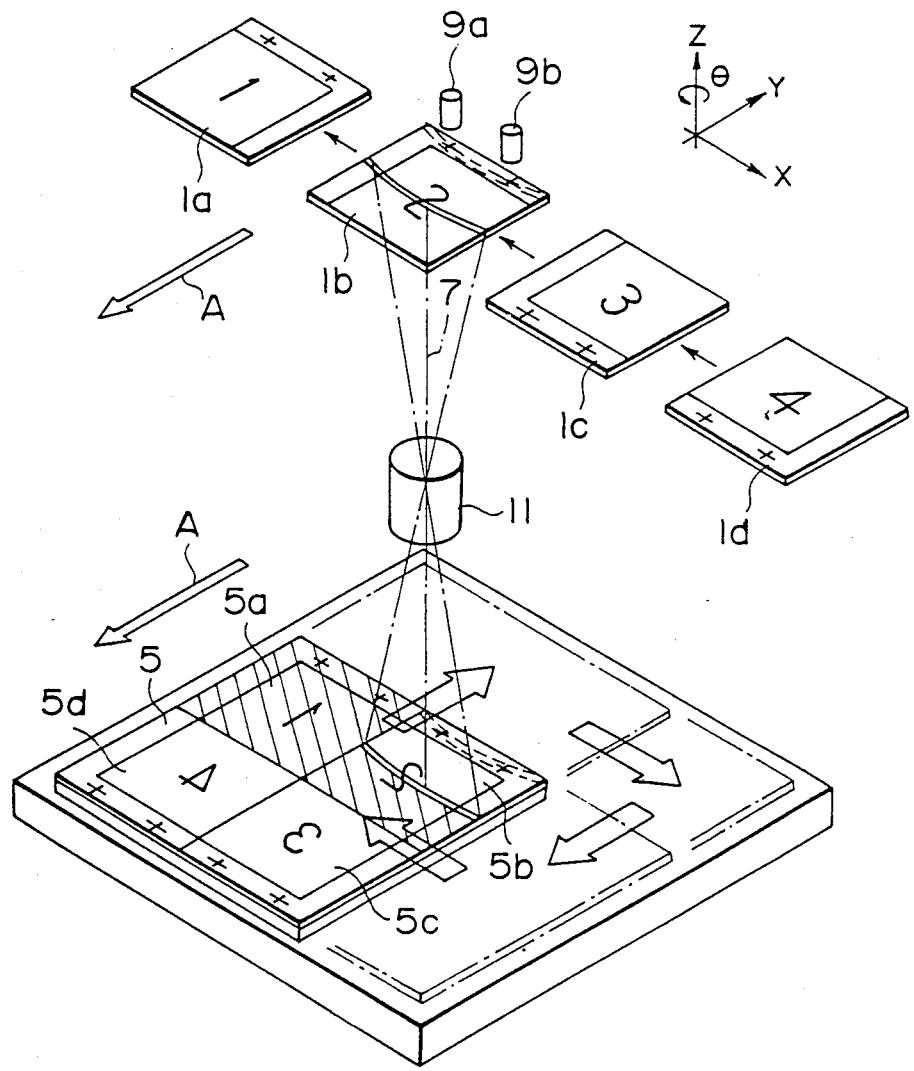
FIG. 4 is a schematic view for explaining the operation of exposure apparatus of the FIG. 3 embodiment.

In FIG. 4, each of the masks 1a-1d is formed with, for the sake of manufacture of liquid crystal display devices, a pattern having a portion of rectangular shape, corresponding to picture elements, and a portion of L-shape corresponding to a drive circuit for the picture elements. In the state of FIG. 4, the pattern of the first mask 1a which is exemplarily illustrated as a character "1" in FIG. 4 has already been transferred onto a first area 5a of the substrate 5, and the pattern of the second mask 1b which is also exemplarily illustrated as a character "2" is just being transferred onto a second portion or area 5b of the substrate 5. However, the explanation will be started here, beginning with the state at the time of completion of the transfer of the pattern "1" of the mask 1a onto the first area 5a of the substrate 5. As will be seen from FIG. 4, the pattern of each of the masks 1a-1d in this embodiment is transferred onto a corresponding one of four areas on the substrate 5, in an inverted form with respect to the X direction.

Upon completion of the transfer of the pattern "1" of the mask 1a onto the area 5a of the substrate 5, the mask supply or changer system including the mask plate 10 is operated to unload the mask 1a the mask stage 2, in the manner described hereinbefore, and to move the mask plate 10 in the X direction so as to move the second mask 1b to a position above the mask stage 2. Thereafter, the mask 1b is loaded on the mask stage 2 in the manner described hereinbefore. Subsequently, the mask stage 2 now carrying thereon the mask 1b is moved in the X, Y, Z and $\theta$ directions by means of an unshown driving unit, so as to accurately place the mask 1b at the exposure station which is predetermined. This is called "mask alignment". Simultaneously with the mask alignment, the substrate 5 is moved by the stage 8 in the X direction and by a predetermined distance, so that the second area 5b of the substrate 5 is accurately positioned at the exposure station at which the pattern "2" of the mask 1b is to be projected onto the area 5b by the mirror projection system 11. The displacement of the substrate 5 is controlled very accurately by means of an unshown laser interferometer.

Subsequently, an unshown Z-axis driving system of the stage 8 is actuated on the basis of the information about the distance between the focal plane of the projection system 11 and the surface of the area 5b of the substrate 5 as detected by the gap sensors 12—12 with respect to plural points on the substrate 5 surface. By this, the surface of the area 5b is accurately brought into coincidence with the focal plane of the projection system 11. This is called "Z-axis alignment" or "focusing". Upon completion of the Z-axis alignment, two alignment marks formed on the mask 1b and two alignment marks formed on the area 5b are observed simultaneously by two objective lenses 9a and 9b of an alignment detecting system and by way of the projection system 11. As shown in FIG. 4, each of these alignment marks comprises a cross mark. In accordance with an output signal from the alignment detecting system, representing the positional relation between the mask 1b and the area 5b, the substrate 5 is moved in appropriate one or ones of the X, Y and θ directions until the alignment marks of the mask 1b and the area 5b are brought into a superposed relation as viewed at the positions of the objective lenses 9a and 9b.

Upon completion of mask-to-substrate alignment, the illumination system 6 illuminates the mask 1b. More specifically, the illumination system 6 defines on the surface of the mask 1b an illumination area of an arcuate shape. This is to meet the shape of the optimum imaging region as defined in the mirror projection system 11. For the details of such optimum imaging region of the mirror projection system 11, reference may be made to U.S. Pat. No. 4,097,125 issued June 27, 1978. As the illumination system defines the arcuate illumination area on the surface of the mask 1b, the holder 15 (FIG. 3A) is moved by an unshown motor in the direction of an arrow A (i.e. in the Y direction) at a constant speed, while being guided by the linear air-bearing units 13—13. By this, the mask 1b and the area 5b of the substrate 5 are moved as a unit relative to the projection system 11 and, therefore, relative to the arcuate illumination area defined by the illumination system. As a result, the area 5b is scanningly exposed to the light beam passed through the pattern "2" of the mask 1b which is scanned by the light beam having an arcuate shape in cross-section. Consequently, upon completion of scanning exposure of the area 5b, the whole of the pattern "2" of the mask 1b is transferred onto the area 5b.

Upon completion of transfer of the pattern "2" onto the area 5b, the stage 8 and the mask plate 10 are actuated again so as to move the third area 5c of the substrate 5 to the exposure station (the pattern projection station of the projection system 11) and to replace the mask 1b on the mask stage 2 by the third mask 1c. Thereafter, each of the objective lenses 9a and 9b is moved in the Y direction by a predetermined distance, in order to allow observation of a corresponding one of two alignment marks formed on the mask 1c and a corresponding one of two alignment marks already printed on the third area 5c of the substrate 5. And, an alignment and exposure operation substantially the same as that described hereinbefore is repeated, whereby the pattern of the third mask 1c which is exemplarily illustrated as a character "3" is transferred onto a third area 5c of the substrate 5 and, thereafter, the pattern of the fourth mask 1d which is exemplarily illustrated as a character "4" is transferred onto a fourth area 5d of the substrate 5. In this manner, the pattern transfer relative to the four areas of the substrate 5 is effected in the clockwise order.

While, in the present embodiment, each of the alignment marks formed on the masks and the areas of the substrate is provided by a cross mark, a mark of any other form such as, for example, disclosed in U.S. Pat. No. 4,167,677 issued Sept. 11, 1979 may of course, used.

After the patterns of the masks 1a–1d are transferred onto the surface of the substrate 5, the substrate 5 is moved by the substrate supply system from the stage 8 back to the containing cassette 18 and is contained therein. During the movement of the substrate 5 back to the containing cassette 1,, the mask plate 10 is operated so as to load the first mask 1a again on the mask stage 2. When the next substrate 5 is placed on the stage 8, the alignment and exposure operation described in the foregoing is repeated.

Figure 5:
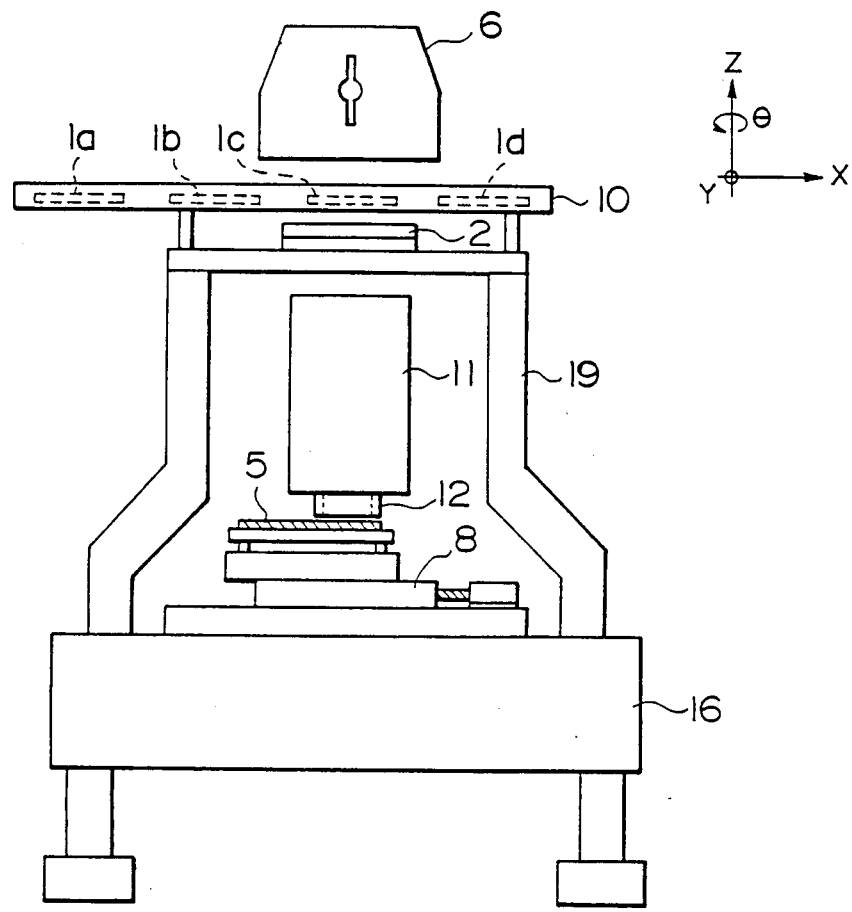
FIG. 5 is a schematic view showing one embodiment of an exposure apparatus of the lens projection type, to which the present invention is applied.
Figure 6:
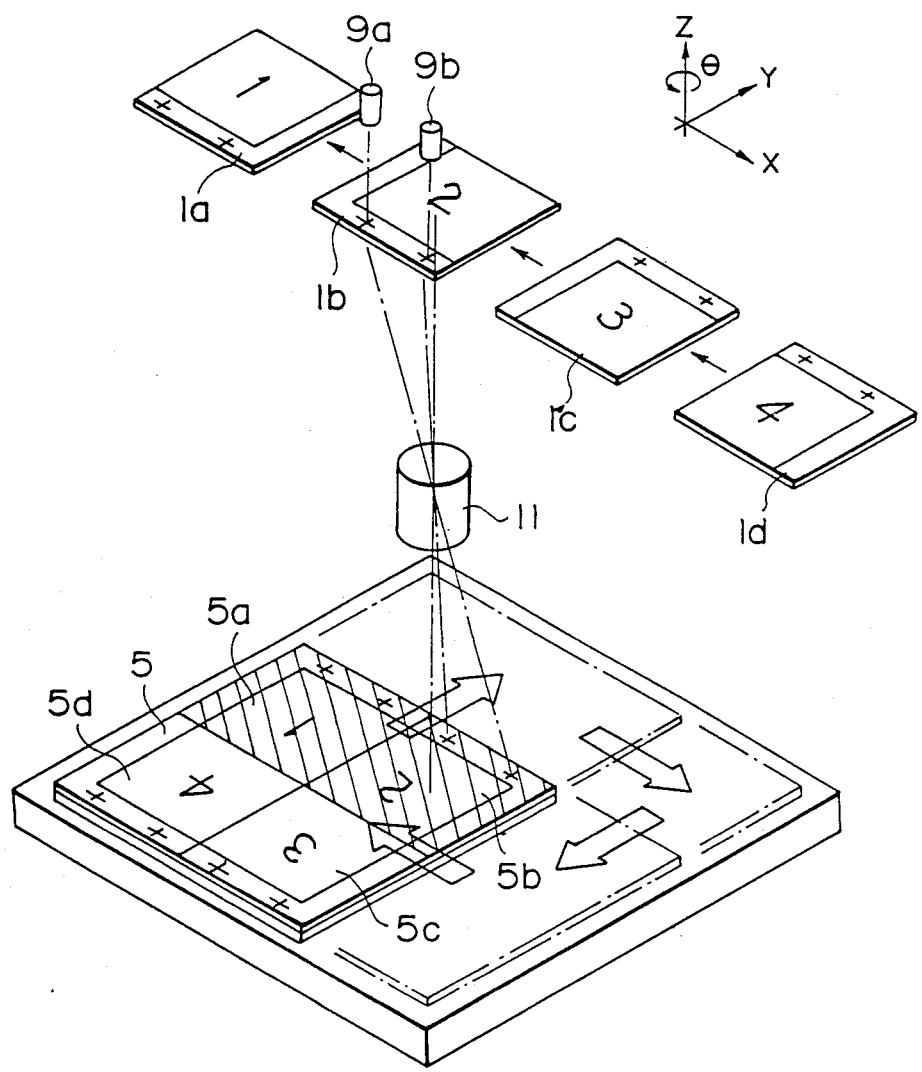
FIG. 6 is a schematic view for explaining the operation of the exposure apparatus of the FIG. 5 embodiment.

Referring now to FIGS. 5 and 6, a further embodiment of the present invention will be described. In this embodiment, the present invention is applied to an exposure apparatus of lens projection type. Also, in this embodiment, elements having similar or corresponding functions as of those of the foregoing embodiments are denoted by the same reference numerals.

In FIG. 5, the exposure apparatus includes a projection system 11 which comprises, in this embodiment, a projection lens system having a reduced magnification, a unit magnification or an enlarged magnification. As compared with the mirror projection system of the FIG. 3 embodiment, the lens projection system 11 of the present embodiment is capable of exposing, at one time, a wider two-dimensional are on a substrate 5 to the light from a mask. This eliminates the necessity of moving a mask stage 2 and the substrate 5 as a unit relative to the projection system 11, as in the FIG. 3 embodiment. And, in the present embodiment, patterns of plural masks are transferred onto the surface of the subtrate 5 by repeating the mask interchange and the substrate displacement, as in the FIG. 1 embodiment. The structure of the present embodiment is thus essentially the same as that of the FIG. 1 embodiment, except for that the substrate and the mask being placed on the mask stage 2 are brought into an optically conjugate relation with respect to the projection system 11. It is to be added that, due to the use of a projection lens system, each of the patterns of the masks 1a–1d when it is projected onto the substrate 5 is inverted with respect to both the X and Y directions.

Since, in the present embodiment, the integral movement of the mask stage 2 and the substrate 5 as in the FIG. 3 embodiment is not necessary, the mask stage 2 and a mask plate 10 carrying the masks 1a–1d are supported by a base member 16 by way of supporting posts 19—19, while the stage 8 for the substrate 5 is directly supported by the same base member 16. The displacement of the substrate 5 by the stage 8 is measured very accurately by means of an unshown laser interferometer.

As seen from FIG. 6, the alignment and exposure operation of the FIG. 5 embodiment is similar to that of the FIG. 3 embodiment as has been described with reference to FIG. 4. In the FIG. 5 embodiment, however, each of the patterns of the masks 1a–1d can be transferred, at once a onto corresponding one of the areas 5a–5d of the substrate 5 because of the wide "exposure field" of the projection lens system 11. So, the mask and the substrate are not moved relative to the projection system 11, as compared with the FIG. 3 embodiment.

Figure 7:
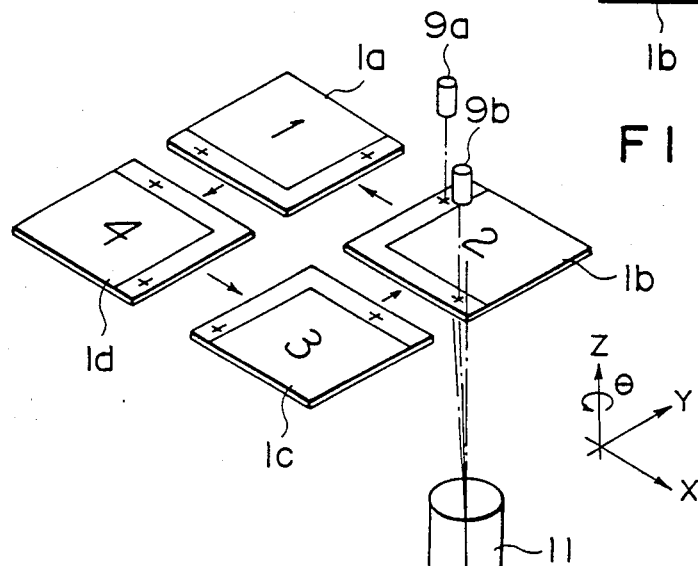
FIG. 7 is a schematic view showing a modified form of the FIG. 5 embodiment.
Figure 7:
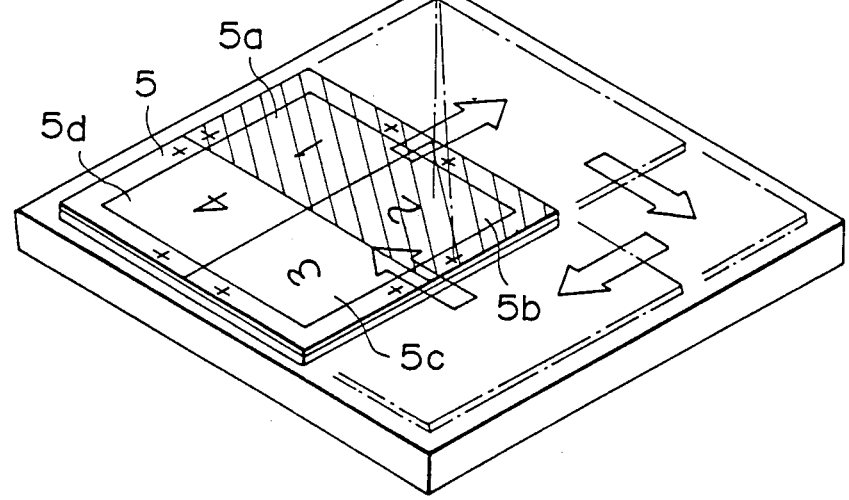

FIG. 7 shows a modification of the FIG. 5 embodiment. In this example, four masks 1a–1d are supported by an unshown mask plate for two-dimensional displacement in an X-Y plane. In accordance with the arrangement of the FIG. 7 example, as compared with that of the FIG. 5 embodiment wherein the masks 1a–1d are supported for one-dimensional displacement, only a narrower movable range in the X direction is required for the movement of the mask plate for the sake of mask replacement. So, only a limited space is required for the mask plate with respect to the X direction.

Also, in the FIG. 7 example, objective lenses 9a and 9b of an alignment detecting system are not arrayed in the X direction but they are arrayed diagonally with respect to the mask, i.e. arrayed in a direction inclined by an angle of 45 degrees relative to the X direction. This allows that two alignment marks provided on each of the masks 1a–1d are formed on the mask surface at positions in the diagonal direction with respect to the same. This means that, if desired, the alignment marks can be formed at the periphery of the mask in such manner that the center of the mask is on a line connecting the alignment marks. Also, the distance between the marks can be made larger. As a result, the accuracy of the mask-to-substrate alignment can be improved.

In the case of FIG. 7, the first to fourth masks 1a–1d carried on the mask plate are moved counterclockwise as illustrated so that they are sequentially moved onto the mask stage 2, in the named order. By this, the patterns of the masks 1a–1d are sequentially transferred onto the first to fourth areas 5a–5d of the substrate 5, in the named order. The remaining portion of the operation is essentially the same as that of the FIG. 5 embodiment.

Figure 8:
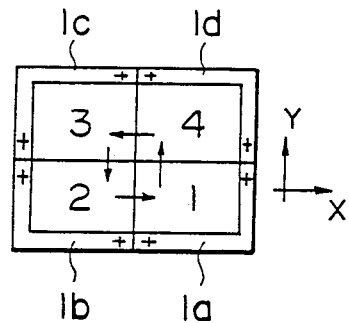
FIG. 8 is a plan view schematically showing a modified form of the FIG. 5 embodiment.

FIG. 8 shows a modification of the FIG. 7 arrangement. That is, the manner of holding the masks 1a–1d by the mask plate as illustrated in FIG. 7 is modified.

In the case of FIG. 7 and where patterns for forming a liquid crystal display device are to be transferred onto the substrate 5, the masks 1a–1d each having a pattern portion of rectangular shape corresponding to the picture elements and a pattern portion of L-shape corresponding to a circuit for driving the picture elements, are held on the mask plate in such manner that the L-shaped pattern portion of each mask is disposed in close proximity to the center of rotation of the mask plate carrying the four masks. In the example of FIG. 8, as compared therewith, the masks 1a–1d are held on the mask plate in such manner that the L-shaped pattern portion of each mask is placed in proximity to the periphery of the mask plate, i.e. away from the center of rotation of the mask plate. Except for this point, the manner of alignment and exposure operation by use of the masks 1a–1d of FIG. 8 is essentially the same as that of the FIG. 7 embodiment.

Figure 9:
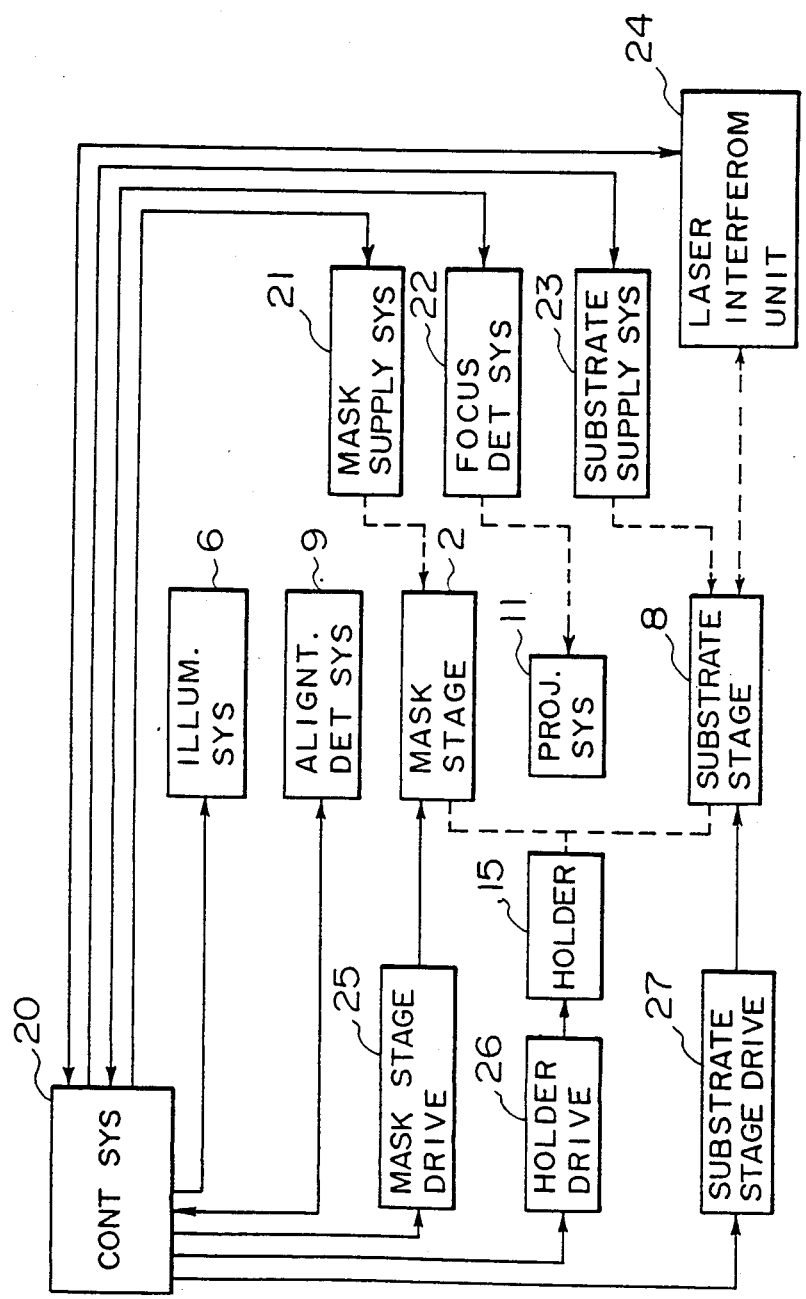
FIG. 9 is a block diagram showing an example of systematic arrangement of an exposure apparatus according to one embodiment of the present invention.

FIG. 9 shows, in a block diagram, a systematic arrangement of an exposure apparatus according to the present invention. The arrangement of the FIG. 9 example corresponds to that of the exposure apparatus of mirror projection type of the FIG. 3 embodiment. Where the exposure apparatus is of proximity type such as the FIG. 1 embodiment, a projection system 11, a holder 15 and a holder driving system 26 shown in FIG. 9 are eliminated and a focus detecting system 23 in this Figure is replaced by a gap detecting system. Also, where the exposure apparatus is of a lens projection type such as the FIG. 5 embodiment, the holder 15 and the holder driving system shown in FIG. 9 are simply eliminated.

In the mirror projection type exposure apparatus shown in FIG. 9 and corresponding to the FIG. 3 embodiment, a control system 20 supplies an operation-instructing signal to each of a mask supply system 21 and a substrate supply system 23. In response thereto, the mask supply system 21 drives the mask plate 10 (FIG. 3A) so as to place the first mask 1a (FIG. 3A) on the mask stage 2. Also, the substrate supply system 23 is operated to take one of the substrates 5 out of the containing cassette 18 (FIG. 3A) with the aid of the conveyor belt 17. The substrate 5 taken out of the cassette 18 is subjected to the prealignment, described hereinbefore, and is placed on the stage 8. The control system 20 also supplies an operation-instructing signal to a mask stage driving system 25. In response thereto, the mask stage driving system 25 is operated so as to bring the mask 1a held on the mask stage 2 into alignment with the projection system 11 with respect to the X, Y and $\theta$ directions. Upon completion of mask alignment, a focus detecting system 22 including the gap sensors 12—12 (FIG. 3A) detects the state of focus of the projection system 11 relative to the substrate 5 held on the stage 8. In accordance with an output signal from the focus detecting system 22, representing the state of focus, the control system 20 supplies an instruction signal to a substrate-stage driving system 27 to cause it to drive the stage 8 thereby to move the substrate 5 in the Z direction, so that the surface of the substrate 5 is brought into coincidence with the focal plane of the projection system 11. Upon completion of Z-axis alignment or focus adjustment, the control system 20 supplies an operation-instructing signal to an alignment detecting system 9. In response thereto, the alignment detecting system 9 is operated to detect, by way of the objective lenses 9a and 9b (FIG. 4), the alignment marks of the mask 1a and the first area 5a of the substrate 5, thereby to detect any positional deviation between the mask 1a and the area 5a of the substrate 5 in the X, Y and $\theta$ directions. On the basis of the thus detected positional deviation, the control system 20 actuates the substrate-stage driving system 27 to cause the stage 8 to move the substrate 5 in appropriate one or ones of the X, Y and $\theta$ directions, so that the alignment marks of the mask 1a and the alignment marks of the area 5a of the substrate 5 are brought into alignment by way of the projection system 11. During such mask-to-substrate alignment, the displacement of the substrate 5 by the stage 8 in each of the X and Y directions is measured by a measuring system 24 having a laser interferometer. And, the result of measurement is transmitted to the control system 20.

Upon completion of mask-to-substrate alignment, the control system 20 supplies an operation-instructing signal to a holder driving system 26. In response thereto, the holder driving system 26 is operated to move, in the Y direction, the holder 15 which carries the mask stage 2 and the substrate stage 8 as a unit. Simultaneously therewith, the control system 20 actuates the illumination system 6 to irradiate the mask 1a with a light beam having an arcuate shape in cross-section. As a result, upon completion of movement of the holder 15, the pattern of the mask 1a is transferred onto the whole surface of the area 5a of the substrate 5. Subsequently, the control system 20 again supplies an operation-instructing signal to the mask supply system 21 so as to replace the mask 1a on the mask stage 2 by the second mask 1b. Also, the control system 20 again supplies an operation-instructing signal to the substrate-stage driving system 27 to cause the stage 8 to move the substrate 5 so that the second area 5b thereof is placed at the exposure station. The alignment and exposure operation described in the foregoing with respect to the first area 5a of the substrate 5 is repeated, whereby the pattern of the second mask 1b is transferred onto the second area 5b of the substrate 5. In a similar manner, the patterns of the remaining masks 1c and 1d are transferred onto the remaining areas 5c and 5d of the substrate 5, respectively. After all the patterns of the masks 1a–1d are transferred onto the whole surface of the substrate 5, the control system 20 again supplies an operation-instructing signal to the substrate supply system 23 to move the substrate 5, on the stage 8, back to the cassette 18.

Figure 10:
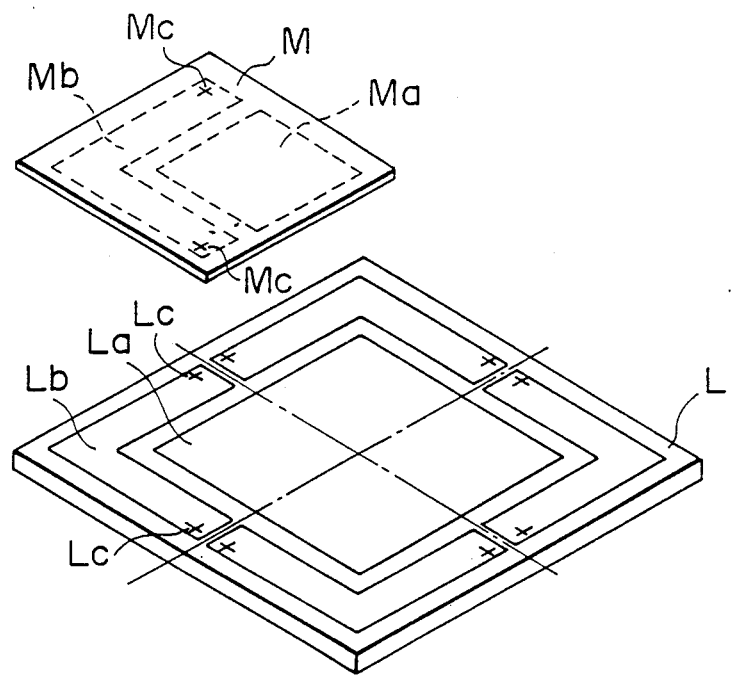
FIG. 10 is a schematic view showing a base plate for a flat panel display device, according to the present invention, and a photomask usable for forming patterns on the base plate.

FIG. 10 shows an example of a substrate or base plate and a mask having a pattern to be transferred onto the substrate. This example is adapted for the manufacture of a flat panel liquid crystal display device.

In FIG. 10, denoted by L is a substrate or base plate to be used in the flat panel liquid crystal display device. The substrate L has a rectangular shape having a diagonal length of an order of 14 inches. In this example, the substrate L as a whole provides an integral display panel, and the formation of the pattern on the substrate by the photolithographic process is accomplished by four "exposures" relative to four discrete areas on the substrate L. As shown in FIG. 10, the surface of the substrate L is divided into four by two phantom lines intersecting at a right angle. For the sake of photolithographic pattern formation, in this example, a mask M shown in FIG. 10 is used. The mask M has a pattern comprising a pattern portion Ma of rectangular shape corresponding to display picture elements arrayed in a matrix form, transistors for the drive of the picture elements, etc. and a pattern portion Mb of substantially L-shape corresponding to driving circuit means such as a shift register device. When the mask M is illuminated, the pattern of the mask M is transferred onto one of the four areas on the substrate L. More particularly, the pattern portion Ma is transferred onto the substrate L to form thereon a pattern portion La, while the pattern portion Mb of the mask is transferred onto the substrate L to form thereon a pattern portion Lb, shown in FIG. 10. Such exposure is repeated relative to each of the remaining three areas on the substrate L. Thus, by four exposures, a single display area of large size is formed on an integral substrate L. As will be described later with reference to FIG. 14, each of the four display sections La—La is controlled, independently from the others, by a corresponding one of the four driving circuit sections Lb—Lb. This provides a possibility of four-channel display where the display device is used as a television receiver.

While, in the FIG. 10 embodiment, driving circuits are formed on the substrate L by a photolithographic process, this is not indispensable. That is, driving circuit devices manufactured separately may be connected to the display panel sections.

The photolithographic pattern transfer for the manufacture of flat panel display devices such as shown in FIG. 10 can be achieved by use of any one of the exposure apparatuses described in the foregoing part of the specification. However, where one and the same pattern is to be formed on each of plural regions on a substrate, such as in the FIG. 10 embodiment, an exposure apparatus of more simple structure such as shown in FIG. 11 is usable.

Figure 11:
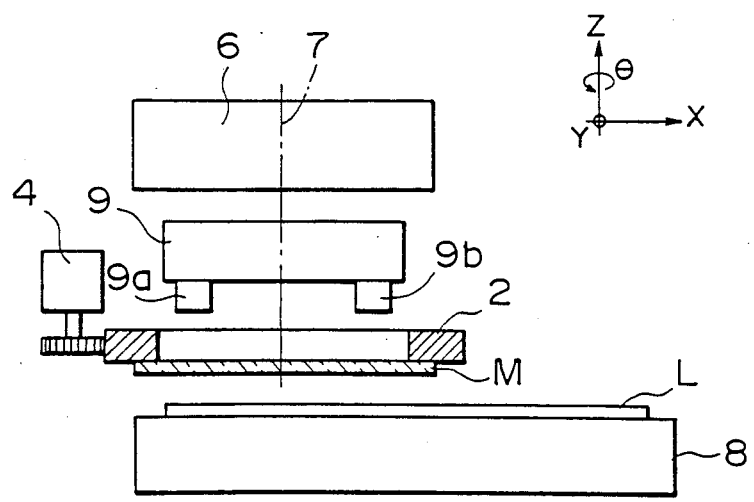
FIG. 11 is a schematic view showing an exposure apparatus of proximity type, according to one embodiment of the present invention, which apparatus is particularly suitably usable for forming a pattern or patterns on the base plate of FIG. 10 by use of the photomask shown in the same Figure.

That is, the exposure apparatus shown in FIG. 11 includes a mask stage 2 for holding the mask M by vacuum suction. The mask stage 2 is adapted to be rotated by a motor 4 in the $\theta$ direction about an optical axis 7 extending in the Z direction Rotation of the mask stage 2 rotates the mask M carried thereby, and, as a result of which, the orientation of the pattern formed on the mask M is changed. Denoted by L in FIG. 11 is a glass substrate, similar to that shown in FIG. 10, onto which the pattern of the mask M is to be transferred by a photolithographic process to provide a flat panel liquid crystal display device. The substrate L has a square shape having a diagonal length of an order of 14 inches.

An illumination optical system 6 is adapted to illuminate the mask M by use of a light from an unshown light source, having a predetermined wavelength or wavelengths. When the mask M is illuminated, a photoresist or photosensitive layer formed on the substrate L is exposed to the light passed through the mask M, whereby the pattern of the mask M is transferred onto the substrate L. A stage 8 holds thereon the substrate L for movement in each of the X, Y, Z and $\theta$ directions. The substrate L is placed in close proximity to the mask M with respect to the Z direction. Also, by the stage 8, the substrate L is held movable in the X and Y directions so that a desired portion of the surface of the substrate L is opposed to the mask 1. The displacement of the substrate L in the X-Y plane by the stage 8 is accurately controlled by an unshown fine measuring system using a laser interferometer.

An alignment detecting system 9 is provided to accomplish alignment of the mask M and the substrate L. The alignment detecting system 9 includes two objective lenses 9a and 9b which are adapted to observe two points on the mask M and to observe, by way of the mask M, two points on the substrate L, at the same time.

Referring also to FIGS. 12A–12D, the operation of the FIG. 11 embodiment will now be described. First, the mask M is placed on the mask stage 2. As shown in FIG. 12A the mask M has a pattern comprising a pattern portion Ma of rectangular shape corresponding to a number of picture elements, for forming a liquid crystal display section on the substrate L, and another pattern portion Mb of substantially L-shape corresponding to a circuit device for controlling actuation of each of the picture elements. The mask M is fixedly held by the mask stage 2 in such manner that the center of the mask M coincides with the optical axis 7 while the periphery of the rectangular pattern portion Ma corresponding to the picture elements extends in parallel to the X or Y direction. After the mask M is set as above, the substrate L is transported onto the stage 8 by an unshown transportation mechanism. In the course of transportation of the substrate L, it is subjected to preparatory alignment (prealignment) by an appropriate prealignment system. So, when the substrate L is held by the stage 8, a first one (L1) of four areas on the substrate L is already approximately aligned with the mask M positioned at the exposure station. After the substrate L is held by the stage 8, an unshown Z-axis driving system of the stage 8 is operated, on the basis of output signals from unshown gap sensors, to move the substrate L in the Z direction so that a minute gap or distance of an order not greater than 30 microns, for example, is uniformly maintained between the mask M and the substrate L.

After completion of Z-axis adjustment, each of an X-axis driving system, a Y-axis driving system and a θ-direction driving system of the stage 8 (which are not shown in the drawing) are operated under the control in accordance with an output signal from the alignment detecting system 9, with the result that the first area L1 of the substrate L is aligned with respect to the mask M. Upon completion of this alignment, the mask M is illuminated with the use of the light from the illumination system 6, such that the first area L1 of the substrate L is exposed to the light passed through the mask M. By this, the pattern of the mask M is transferred onto the area L1 of the substrate L.

After completion of pattern transfer relative to the area L1, the mask stage 2 is rotationally moved clockwise by the motor 4 by an angle of 90degrees, whereby the orientation of the pattern of the mask M is changed into such as shown in FIG. 12B. At the same time, the substrate L is moved by the stage 8 in the direction of an arrow shown in FIG. 12A (i.e. in the X direction), through a predetermined distance. By this, a second area L2 of the substrate L is now opposed to the mask M, as shown in FIG. 12B. Thereafter, the alignment of the second area L2 in each of the X, Y, Z and θ directions is effected in a similar manner described hereinbefore. Then, the pattern of the mask M, which is in a 90-degree rotated state shown in FIG. 12B, is transferred onto the second area L2 of the substrate L. The 90-degree rotation of the mask stage 2 and the stepwise or rectilinear displacement of the substrate L by the stage 8 are repeated each time the illumination of the mask M is completed. Thus, while intermittently changing the orientation of the pattern of the mask M each by 90 degrees, the pattern of the mask is transferred onto each of third and fourth areas L3 and L4 of the substrate L. As a result, at the central portion of the substrate L, a single liquid-crystal display region comprising four picture-element patterns Ma—Ma which are electrically isolated from each other, is formed. Also, at the peripheral portion of the substrate L, a driving-circuit region comprising four driving-circuit patterns Mb—Mb, for driving the liquid crystal display device is formed.

Upon transfer of the pattern of the mask M onto one of the four areas on the substrate L, the remaining three areas of the substrate L which are not opposed to the mask M are prevented, by suitable means, from being exposed to the light from the illumination system 6.

Figure 13A:
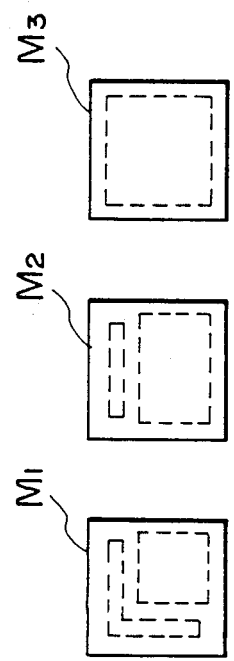
FIG. 13A is a schematic view showing examples of photomasks.
Figure 13C:
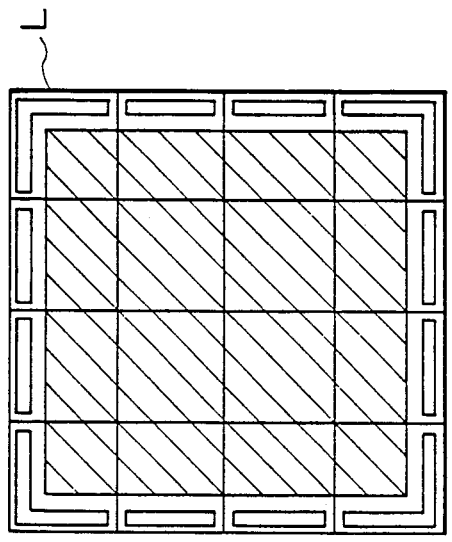
FIGS. 13B are 13C are schematic views, respectively, showing examples or flat panel display devices which can be manufactured by use of the photomasks in FIG. 13A.
Figure 13B:
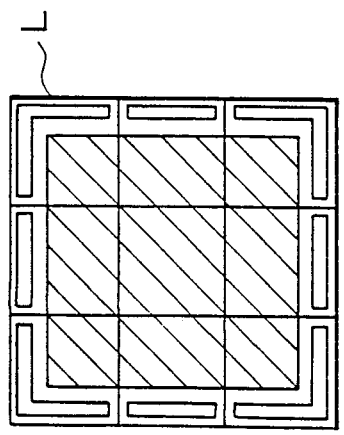

FIGS. 13A–13C show modifications of the FIG. 10 example. Of these FIGS, FIG. 13A shows use of different masks having different patterns. In the FIG. 13A example, three masks M1–M3 having different patterns are used. With the use of such different masks having different patterns, flat panel display devices of larger size can be manufactured by the photolithographic process. Examples are shown in FIGS. 13B and 13C, respectively. That is, FIG. 13B shows manufacture of a flat panel display device by "nine (9) exposures", while FIG. 13C shows manufacture of the same by "sixteen (16) exposures". More specifically, the surface of a substrate L is imaginarily divided into nine (in FIG. 13B example) or sixteen (FIG. 13C example) discrete areas. And, each of these areas is exposed to the light passed through a corresponding one of the masks M1–M3 shown in FIG. 13A. As a result, by use of three masks M1–M3 having different patterns, a pattern for forming a flat panel display device is transferred onto the substrate L by nine exposures (FIG. 13B case) or sixteen exposures (FIG. 13C c In the FIG. 13B or 13C example, some of the discrete areas on the substrate L may not be provided with alignment marks such as, for example, shown in FIG. 4. Even in such case, the positioning of such area having no alignment mark with respect to the mask, being placed at the exposure station, can be satisfactorily achieved by displacing the substrate L while accurately measuring the displacement by use of the laser interferometer. That is, the alignment of such area having no alignment mark is attainable while relying on the precision of measurement of the laser interferometer. Since, in the flat panel display devices such as liquid crystal display devices, the width of a line forming the pattern is usually of an order not less than 3–5 microns. Accordingly, the precision of measurement of the laser interferometer does assure satisfactory resolution for such pattern.

Also, for the first-time pattern-transfer operation to be effected to form the first one of plural layers of a display device, and if some continuity is required between two first-layer patterns to be transferred onto two adjacent areas of the substrate L (which has not been exposed), such continuity can be satisfactorily assured by the precision of measurement of the laser interferometer, regardless of that any alignment marks are not yet printed on the substrate. If the continuity is once achieved for the first layer, the continuity between patterns, for the second layer, to be superimposingly transferred onto the first-layer patterns which have already been transferred onto two adjacent areas on the substrate with satisfactory continuity, can, of course, be attained during the course of alignment of each area of the substrate with the mask, with the aid of the alignment marks having been printed on the first layer. This means that a plurality of paterns can be formed on the substrate with sufficient continuity and, as a result of which, a display panel having a integral display region of a large area, not having discrete display sections, can be manufactured, if it is desired.

FIG. 14 is a block diagram schematically showing the manner of control of display, in a flat panel display device according to an embodiment of the present invention. In this embodiment, the device comprises a liquid crystal display panel region La0 formed on an integral substrate L. The display panel region La0 is provided by four display sections La1–La4. Also, four driving circuits Lb1–Lb4 are formed on the peripheral portion of the substrate L. Each of the display sections La1–La4 is driven by a corresponding one of the driving circuits Lb1–Lb4, independently from the others. Display signals to be supplied to the display panel La0 are produced by a display signal generating circuit 30. One display signal for forming an integral "picture" on the display panel region La0 is divided, in the display signal generating circuit 30 into four corresponding respectively to the four sections La1–La4. And, from the display signal generating circuit 30, four independent signal components are supplied respectively to the four driving circuits Lb1–Lb4 to actuate corresponding display sections La1–La4. Thus, the four signal components from the display signal generating circuit 30 are combined into one, in the display panel region La0, so that the integral "picture" is displayed in the display panel region La0.

In the foregoing embodiments, the invention has been described with reference to cases where the substrate is displaced in the X and Y directions for the sake of repetition of exposure relative to plural areas on the substrate. However, this may be modified. That is, it is a possible alternative to displace the substrate in the $\theta$ (rotational) direction so as to sequentially place the discrete areas on the substrate at the exposure station. Also, the four-division of the surface of the substrate, described with reference to some of the embodiments, is not indispensable, and two-division, six-division, eight-division, etc. may, of course, be usable.

While the invention has been described with reference to the structures disclosed herein, it is not confined to the details set forth and this application is intended to cover such modifications or changes as many come within the purposes of the improvements or the scope of the following claims.

What is claimed is:

1. A method of exposure usable with an optical projection system, for manufacture of a flat panel display device, comprising the steps of:
    providing first and second masks having different mask patterns, including a display element forming pattern;
    placing a workpiece having a surface on a movable stage;
    moving the movable stage so that two-dimensionally arrayed different portions of the workpiece surface are placed, in sequence, at an exposure station at which the portion of the workpiece surface placed thereat can be patterningly exposed by projection by the optical projection system; and
    handling the first and second masks and selecting a pattern to be projected by the optical projection system upon the portion of the workpiece surface placed at the exposure station,
    wherein the moving of the movable stage is so interrelated to the handling of the first and second masks and the selection of the pattern to be projected that under the influence of the optical projection system plural display element forming patterns are printed two-dimensionally on a first region of the workpiece surface while plural driving element forming patterns are printed on a second region of the workpiece surface outside of the first region.

* * * * *

UNITED STATES PATENT AND TRADEMARK OFFICE
CERTIFICATE OF CORRECTION

PATENT NO. : 4,878,086                            Page 1 of 3
DATED     : October 31, 1989
INVENTOR(S) : Junji Isohata, et al.

It is certified that error appears in the above-identified patent and that said Letters Patent is hereby corrected as shown below:

ON THE COVER

Line [22], "Filed: Mar. 20, 1988" should read
--Filed: Mar. 20, 1989--.

IN THE ABSTRACT

Line 13, "which" should read --while--.

IN THE DISCLOSURE

COLUMN 3

Line 17, "the" (third occurrence) should read
--of the--.
        Line 61, "of a" should read --of control of a--.

COLUMN 4

Line 20, "θ" should read --θ direction--.
        Line 45, "light a," should read --light, a--.

COLUMN 6

Line 24, "8 directions" should read
--θ directions--.
        Line 64, "mounted" should read --Mounted--.

UNITED STATES PATENT AND TRADEMARK OFFICE
CERTIFICATE OF CORRECTION

PATENT NO. : 4,878,086

DATED : October 31, 1989

INVENTOR(S) : Junji Isohata, et al.

It is certified that error appears in the above-identified patent and that said Letters Patent is hereby corrected as shown below:

COLUMN 8

Line 59, "mask 1a" should read --mask 1a from--.

COLUMN 9

Line 39, "8 directions" should read --θ directions--.

COLUMN 10

Line 16, "may" should read --may,--.
Line 22, "containing cassette 1,," should read --containing cassette 18,--.
Line 41, "are" should read --area--.
Line 51, "for" should be deleted.

COLUMN 11

Line 6, "once a onto" should read --once, onto a--.

COLUMN 14

Line 16, "direction" should read --direction.--.

UNITED STATES PATENT AND TRADEMARK OFFICE
CERTIFICATE OF CORRECTION

PATENT NO. : 4,878,086

DATED : October 31, 1989

INVENTOR(S) : Junji Isohata, et al.

Page 3 of 3

It is certified that error appears in the above-identified patent and that said Letters Patent is hereby corrected as shown below:

COLUMN 15

Line 24, "90degrees," should read --90 degrees,--.

COLUMN 16

Line 9, "(FIG. 13C c" should read --(FIG. 13C case).--.
Line 34, "of" should be deleted.
Line 46, "a integral" should read --an integral--.

Signed and Sealed this

Sixteenth Day of April, 1991

Attest:

HARRY F. MANBECK, JR.

Attesting Officer

Commissioner of Patents and Trademarks